(12) United States Patent
Choi et al.

(10) Patent No.: US 7,557,571 B2
(45) Date of Patent: Jul. 7, 2009

(54) FLUXGATE SENSOR INTEGRATED IN SEMICONDUCTOR SUBSTRATE AND METHOD FOR MANUFACTURING THE SAME

(75) Inventors: Won-youl Choi, Suwon (KR); Kyung-won Na, Yongin (KR); Sang-on Choi, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 221 days.

(21) Appl. No.: 10/241,558

(22) Filed: Sep. 12, 2002

(65) Prior Publication Data

US 2003/0173963 A1 Sep. 18, 2003

(30) Foreign Application Priority Data

Mar. 14, 2002 (KR) .......................... 2002-0013945

(51) Int. Cl.
*G01R 33/04* (2006.01)
*G01R 33/02* (2006.01)

(52) U.S. Cl. ..................... 324/253; 324/252; 324/249

(58) Field of Classification Search ......... 324/244–262, 324/117 R, 117 H, 225; 338/32 R, 32 H
See application file for complete search history.

(56) References Cited

U.S. PATENT DOCUMENTS

| 2,432,514 | A | * | 12/1947 | Depp et al. | ................. | 324/253 |
| 2,856,581 | A | * | 10/1958 | Alldredge | ................... | 324/253 |
| 4,864,238 | A | * | 9/1989 | Seitz | .......................... | 324/253 |
| 6,411,086 | B1 | * | 6/2002 | Choi et al. | .................. | 324/253 |
| 6,417,665 | B1 | * | 7/2002 | Scarzello et al. | ............ | 324/253 |
| 6,690,164 | B1 | * | 2/2004 | Fedeli et al. | ................. | 324/253 |

(Continued)

FOREIGN PATENT DOCUMENTS

GB 2339294 A * 1/2000

(Continued)

OTHER PUBLICATIONS

Article "A micro-fluxgate magnetic sensor using micromachined planar solenoid coils"; authors: Liakopoulos, Trifon M. and Ahn, Chong H.; published 1999.

(Continued)

*Primary Examiner*—Reena Aurora
(74) *Attorney, Agent, or Firm*—Sughrue Mion, PLLC

(57) ABSTRACT

A fluxgate sensor is integrated in a semiconductor substrate. The fluxgate sensor has two bar type soft magnetic cores, or a rectangular-ring type soft magnetic core to form a closed magnetic path on the semiconductor substrate, with an excitation coil formed of a metal layer either of the united structure winding the two bar-type cores or two longer sides of the rectangular-ring type core altogether and substantially in a number '8' pattern, or of a separated structure winding the two bar type cores or two longer sides of the rectangular-ring type core, respectively, in a number '8' pattern. Also, a pickup coil is formed on the two bar-type cores or two longer sides of the rectangular-ring type core, either of the united structure winding the two bar-type cores or two longer sides of the rectangular-type core altogether in a solenoid pattern, or of the separated structure winding the two bar type cores or two longer sides of the rectangular-ring type core, respectively, in a solenoid pattern.

16 Claims, 8 Drawing Sheets

U.S. PATENT DOCUMENTS 7,208,947 B2 * 4/2007 Park et al. .................. 324/253

FOREIGN PATENT DOCUMENTS

| JP | 4834576 | 5/1973 |
| JP | 01219580 | 9/1989 |
| JP | 08179023 | 7/1996 |
| JP | 408179023 | * 9/1996 |
| JP | 08285929 | 11/1999 |

OTHER PUBLICATIONS

Article "New Hybrid Technology for Planar Fluxgate Senor Fabrication"; authors: Dezzuari, Olivier; Belloy, Eric; Gilbert, Scott E.; and Gijs, Martin A. M.; pp. 8111-8117, published Jul. 1999.

* cited by examiner

FLUXGATE SENSOR INTEGRATED IN SEMICONDUCTOR SUBSTRATE AND METHOD FOR MANUFACTURING THE SAME

BACKGROUND OF THE INVENTION

1. Field of the Invention

The present invention generally relates to a fluxgate sensor, and more particularly, to a fluxgate sensor integrated in a semiconductor substrate and a manufacturing method thereof. The present application is based on Korean Patent Application No. 2002-13945, filed Mar. 14, 2002, which is incorporated herein by reference.

2. Description of the Prior Art

Existence of magnetic energy has been proven through various physical phenomena, and a fluxgate sensor enables a human to indirectly perceive magnetic energy, as it is unperceivable to human sense organs such as eyes and ears. As for the fluxgate sensor, a magnetic sensor employing a soft magnetic coil has been used for a long time. The magnetic sensor is made by winding a coil around a relatively large bar-shaped core or an annular core formed of a soft magnetic ribbon. Also, an electronic circuit is employed to obtain a magnetic field in proportion to the measured magnetic field.

The conventional fluxgate sensor, however, has the following problems. That is, due to the structure of the conventional fluxgate sensor in which the coil is wound around a large bar-shaped core or an annular core made of soft magnetic ribbon, production costs are high, and the volume of the overall system is large.

Also, flux leakage is inevitable in the flux change due to the excitation coil and the detected magnetic field. Accordingly, high sensitivity cannot be guaranteed.

SUMMARY OF THE INVENTION

The present invention has been made to overcome the above-mentioned problems of the prior art. Accordingly, it is an object of the present invention to provide a high sensitivity fluxgate sensor integrated in a semiconductor substrate capable of not only reducing overall volume of a system, but also detecting a magnetic field with more accuracy, and a manufacturing method for manufacturing such a highly sensitive fluxgate sensor.

Another object of the present invention is to prevent an induction wave in a flux change detecting coil when the external magnetic field is measured as zero (0).

The above objects are accomplished by a fluxgate sensor according to the present invention, including: a soft magnetic core formed to form a closed magnetic path on a semiconductor substrate; an excitation coil formed as a metal film, winding the soft magnetic core; and a pick-up coil formed on the same plane as the excitation coil, the pick-up coil formed as a metal film for winding the soft magnetic core.

The soft magnetic core has two bars placed on the same plane in parallel relation. The two bars are positioned such that the length thereof lies in the direction of magnetic field detection. Meanwhile, the soft magnetic core can be formed as a rectangular-ring, and in this case also, the rectangular-ring is positioned to have its length in the direction of the magnetic field detection.

The excitation coil has a structure of alternately winding the two bars substantially in a number '8' pattern. Alternatively, the excitation coil can have a structure of winding the two bars, respectively, and substantially in a solenoid pattern. When rectangular-ring is used for the soft magnetic core, the excitation coil either has a structure of alternately winding two longer sides of the rectangular-ring in the direction of magnetic field detection substantially in a letter '8' pattern, or has a structure of winding the two longer sides, respectively.

The pick-up coil is placed on the same plane as the excitation coil that has a structure of alternately winding the two bars or two longer sides altogether in number '8' pattern, or winding the two bars or two longer sides, respectively, in a solenoid pattern. The pick-up coil has a structure of winding the two bars or the two longer sides altogether, substantially in a solenoid pattern. Alternately, the pick-up coil can be placed on the same plane as the excitation coil that has a structure of winding the two bars or the two longer sides of the rectangular-ring altogether in the number '8' pattern, or winding the two bars or the two longer sides of the rectangular-ring, respectively, in the solenoid pattern. In this case, the pick-up coil has a structure of winding the two bars or the two longer sides of the rectangular ring, respectively, in the solenoid pattern.

The above objects are also accomplished by a method for manufacturing a fluxgate sensor according to the present invention, including the steps of: forming a lower portion of an excitation coil and a pick-up coil by etching an upper surface of a semiconductor substrate according to a predetermined pattern for the lower portion for the excitation coil and the pick-up coil, and then firstly putting a metal in the etched area; forming a first insulating layer on the upper portion of the semiconductor substrate in which the metal is firstly put; forming first via holes by piercing through the insulating layer at locations distanced from each other by a predetermined distance, to interconnect with the metal firstly-put in the etched area; forming a soft magnetic core by bonding a soft magnetic film on an upper portion of the first insulating layer that has the first via holes formed therein, and patterning and etching; forming a second insulating layer on an upper portion of the semiconductor substrate that has the soft magnetic core formed therein; forming via holes interconnecting with the metal at locations corresponding to the first via holes; and forming an upper portion for the excitation coil and the pick-up coil by, applying a photosensitive material on an upper portion of the second insulating layer that has the second via holes formed therein; performing an etching according to the pattern for the upper portion of the excitation coil and the pick-up coil; and secondly putting a metal in the etched area.

The step of forming the lower portion for the excitation coil and the pick-up coil includes the steps of: applying a photosensitive material on the upper portion of the semiconductor substrate; forming a pattern for the lower portion of the excitation coil and the pick-up coil by an exposure with respect to the photosensitive material applied to the upper portion of the semiconductor substrate; etching according to the pattern for the lower portion of the excitation coil and the pick-up coil; forming an oxide layer on the upper portion of the semiconductor substrate on the etched section; forming a seed layer along the oxide layer; forming a metal layer on the upper portion of the semiconductor substrate, filling the etched area of the seed layer with the metal; and polishing the upper surface of the semiconductor substrate to insulate the metal of the etched area.

The step of forming the lower portion for the excitation coil and the pick-up coil includes the steps of: forming an oxide layer on the upper surface of the semiconductor substrate; forming a seed layer on an upper portion of the oxide layer; applying a thick photo resist on an upper portion of the seed layer; forming a pattern for the lower portion for the excitation coil and the pick-up coil by using an exposure with respect to the thick photo resist applied on the upper portion of the seed layer; forming a metal layer on the upper portion of the semiconductor substrate, filling the patterned area with a metal; and removing the seed layer and the photosensitive material that is applied on the upper portion of the seed layer to insulate the metal that is filled in the etched area for forming the lower portion for the excitation coil and the pickup coil.

The step of forming the upper portion for the excitation coil and the pick-up coil includes the steps of: applying the photosensitive material on the upper portion of the second insulating layer that has the second via holes formed therein; forming a pattern for the upper portion of the excitation coil and the pick-up coil by using an exposure with respect to the photosensitive material applied on the upper portion of the second insulating layer; forming a seed layer along the patterned section; secondly putting a metal in the patterned area corresponding to the pattern for the upper portion for the excitation coil and the pick-up coil; polishing the upper surface to insulate the metal filled in the patterned area; and removing the photosensitive material on the upper portion of the second insulating layer except the secondly-put metal.

The step of forming the upper portion for the excitation coil and the pick-up coil includes the steps of: forming a seed layer on an upper portion of the second insulating layer that has the second via holes formed therein; applying a thick photo resist on the upper portion of the seed layer; forming a pattern for an upper portion of the excitation coil and the pick-up coil by an exposure with respect to the thick photo resist applied on the upper portion of the seed layer; putting a metal in the patterned area corresponding to the upper portion of the excitation coil and the pick-up coil; and removing the seed layer and the thick photo resist that is applied on the upper portion of the seed layer, to insulate the metal that is filled in the patterned area for forming the upper portion of the excitation coil and the pick-up coil.

According to the present invention, by forming a soft magnetic core along a direction of magnetic field detection, counter-magnetic properties can be reduced, while there is no induction wave in a flux change detecting coil due to the structure in which a magnetic field change detecting coil is mounted on an excitation coil that is wound around the soft magnetic core.

BRIEF DESCRIPTION OF THE DRAWINGS

The above-mentioned objects and the feature of the present invention will be more apparent by describing the preferred embodiment of the present invention by referring to the appended drawings, in which.

DETAILED DESCRIPTION OF THE PREFERRED EMBODIMENTS

From now on, the present invention will be described in greater detail by referring to the appended drawings.

Figure 1:
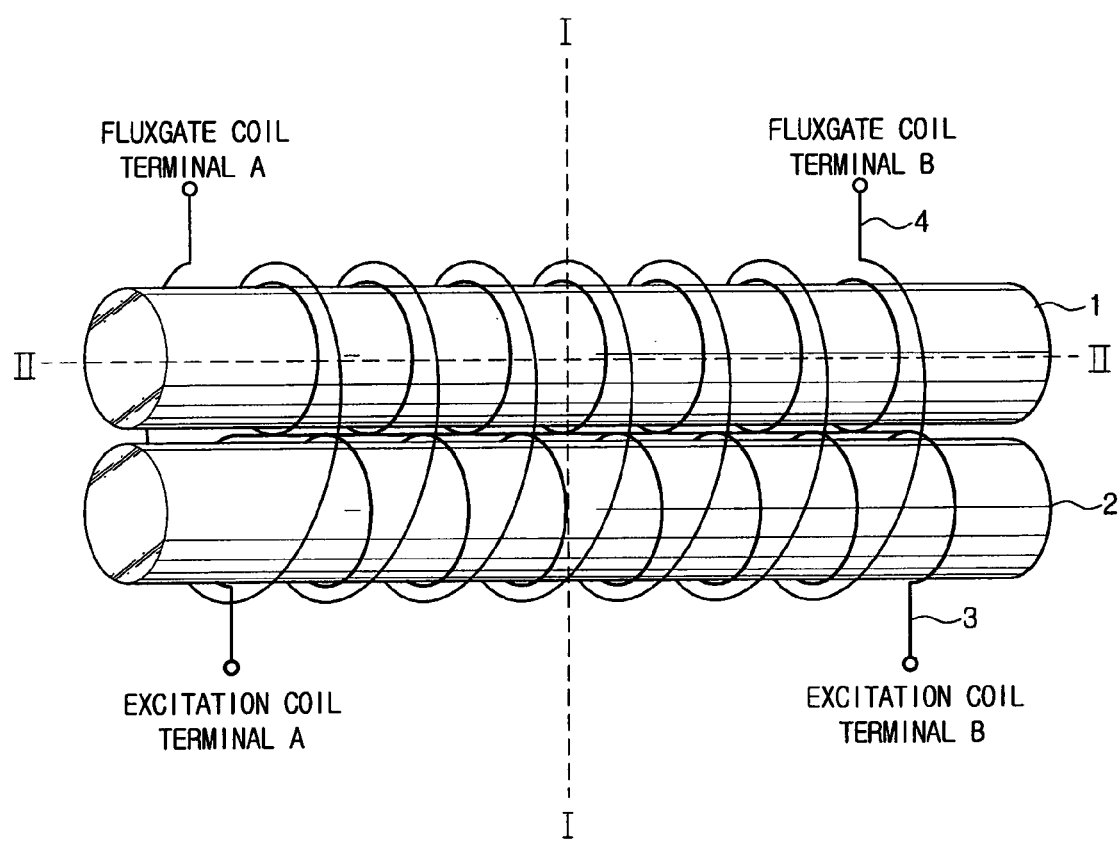
FIG. 1 is a view showing a fluxgate sensor according to a first preferred embodiment of the present invention.

FIG. 1 is a view illustrating a fluxgate sensor integrated in a semiconductor substrate according to the first preferred embodiment of the present invention.

In the fluxgate sensor, first and second bar-type soft magnetic cores 1 and 2 in parallel with each other are wound by an excitation coil 3 substantially in a number '8' pattern, and a pick-up coil 4 is formed on the excitation coil 3, winding the first and the second soft magnetic cores 1 and 2 altogether. The excitation coil 3 can be wound around the first and second bar-type soft magnetic cores 1 and 2, respectively. Also, the pick-up coil 4 can have the structure formed on the excitation coil 3, winding the first and second bar-type soft magnetic cores 1 and 2, respectively.

For convenience in explanation, let us call the structure winding the first and second soft magnetic cores in a number '8' pattern a 'united structure', and the structure winding the first and second soft magnetic cores respectively a 'separated structure'. In the case of a rectangular-ring type soft magnetic core, which will be described later in the second preferred embodiment, the structure winding two longer sides of the rectangular-ring type soft magnetic core in a number '8' pattern will be called a 'united structure', while the structure winding the two longer sides, respectively, will be called a 'separated structure'.

Figure 2:
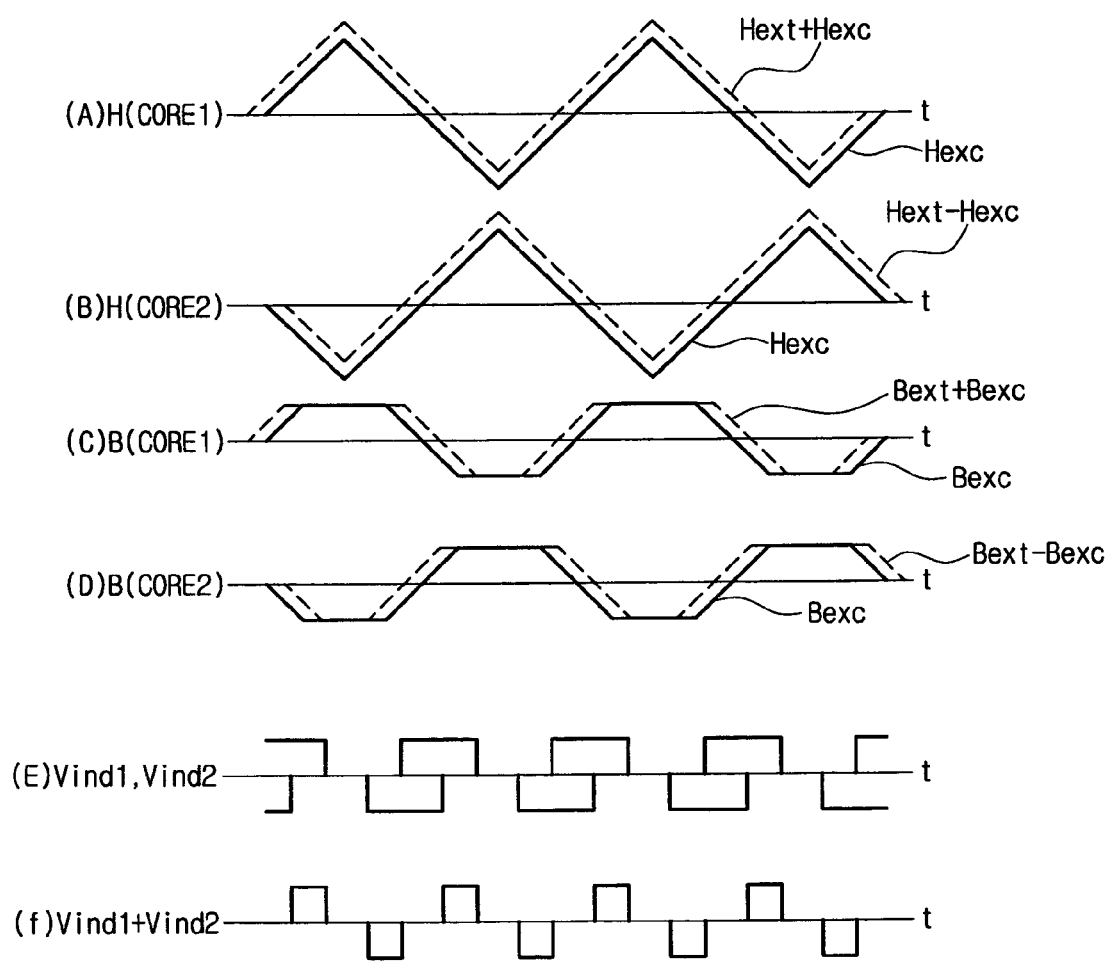
FIGS. 2A through 2F are waveforms for illustrating the operation of the fluxgate sensor of FIG. 1.

FIGS. 2A through 2F are timing views for explaining the operation of the fluxgate sensor of FIG. 1. FIG. 2A is a waveform of a magnetic field generated from the first soft magnetic core 1, FIG. 2B is a waveform of a magnetic field generated from the second soft magnetic core 2, FIG. 2C is a waveform of a flux density generated from the first soft magnetic core 1, FIG. 2D is a waveform of a flux density generated from the second soft magnetic core 2, and FIGS. 2E and 2F are, respectively, waveforms of the first and second induction voltages Vind1 and Vind2, and the sum (Vind1+Vind2) of the first and second induction voltages.

With the excitation coil 3 wound around the first and second bar-type soft magnetic cores 1 and 2 in the number '8' pattern as shown in FIG. 1, and with the supply of AC excitation current, internal magnetic field (Hext+Hexc) and the flux density (Bext+Bexc) at the first bar-type soft magnetic core 1, and the internal magnetic field (Hext-Hexc) and the flux density (Bext-Bexc) at the second bar-type soft magnetic core 2 act in opposite directions (FIGS. 2A, 2B, 2C, 2D). Here, Hext is the external magnetic field, Hexc is the magnetic field caused by the excitation coil 3, Bext is the external magnetic field, and Bexc is the flux density caused by the excitation coil 3.

The pick-up coil 4 is wound to obtain the sum of the flux in each of the cores 1 and 2, and to detect the flux changes by the electronic induction caused by the AC excitation current. Since the induction voltage at the pickup coil 4 has internal magnetic fields acting in opposite directions, the induction voltage detected at the pick-up coil 4 is the result of offsetting the two symmetrically generated induction voltages Vind1 and Vind2 (FIG. 2F). In other words, because the external magnetic field Hext acts in the same direction with respect to the first and second bar-type soft magnetic cores 1 and 2, the internal magnetic fields generated from the first and second cores 1 and 2 are Hext+Hexc and Hext-Hexc. As shown in FIG. 2E, the voltages Vind1 and Vind2 are induced at the pick-up coil 4, respectively, and by detecting the sum of the induction voltages Vind1 and Vind2, the magnitude of the external magnetic field Hext can be obtained.

In the fluxgate sensor constructed as described above, it is most important to have the appropriate structure of two soft magnetic cores 1 and 2, the excitation coil 3 of the united structure winding the two soft magnetic cores 1 and 2 in a number '8' pattern, and the pick-up coil 4 winding over the excitation coil 3 in the solenoid pattern. This is because, in the absence of the external magnetic field Hext, such structure offsets the induction waves of the magnetic fields generated by the first and second bar-type soft magnetic cores 1 and 2, and the flux generated by the excitation coil 3 forms a closed magnetic path.

The soft magnetic core of FIG. 1 can take the form of a rectangular ring. In this case, the same benefit as from the bar-type soft magnetic cores can be obtained by the structure in which the excitation coil 3 is wound around two longer sides of the rectangular-ring type soft magnetic core, and the pick-up coil 4 is wound around the two longer sides in a solenoid pattern.

The detection of a magnetic field is also possible by the structure of a single bar-type core being arranged with the excitation coil and the pick-up coil. This case, however, requires more complicated signal processing of the output from the detecting coil such as amplification and filtering, because there are induction voltage waves generated at the detection coil by the larger excitation coil even in the absence of the external magnetic field. Accordingly, using either the two bar-type cores or a single rectangular-ring type core will allow more advantages, especially in terms of signal processing requirements.

FIGS. 3A through 3E are sectional views taken on lines I-I and II-II of the fluxgate sensor of FIG. 1, for explaining the process of producing the fluxgate sensor on the semiconductor substrate. More specifically, the right sides of FIGS. 3A through 3E show the sectional views taken on line I-I, while the left sides show the sectional views taken on line II-II.

The process of producing the fluxgate sensor will be described below.

Figure 3:
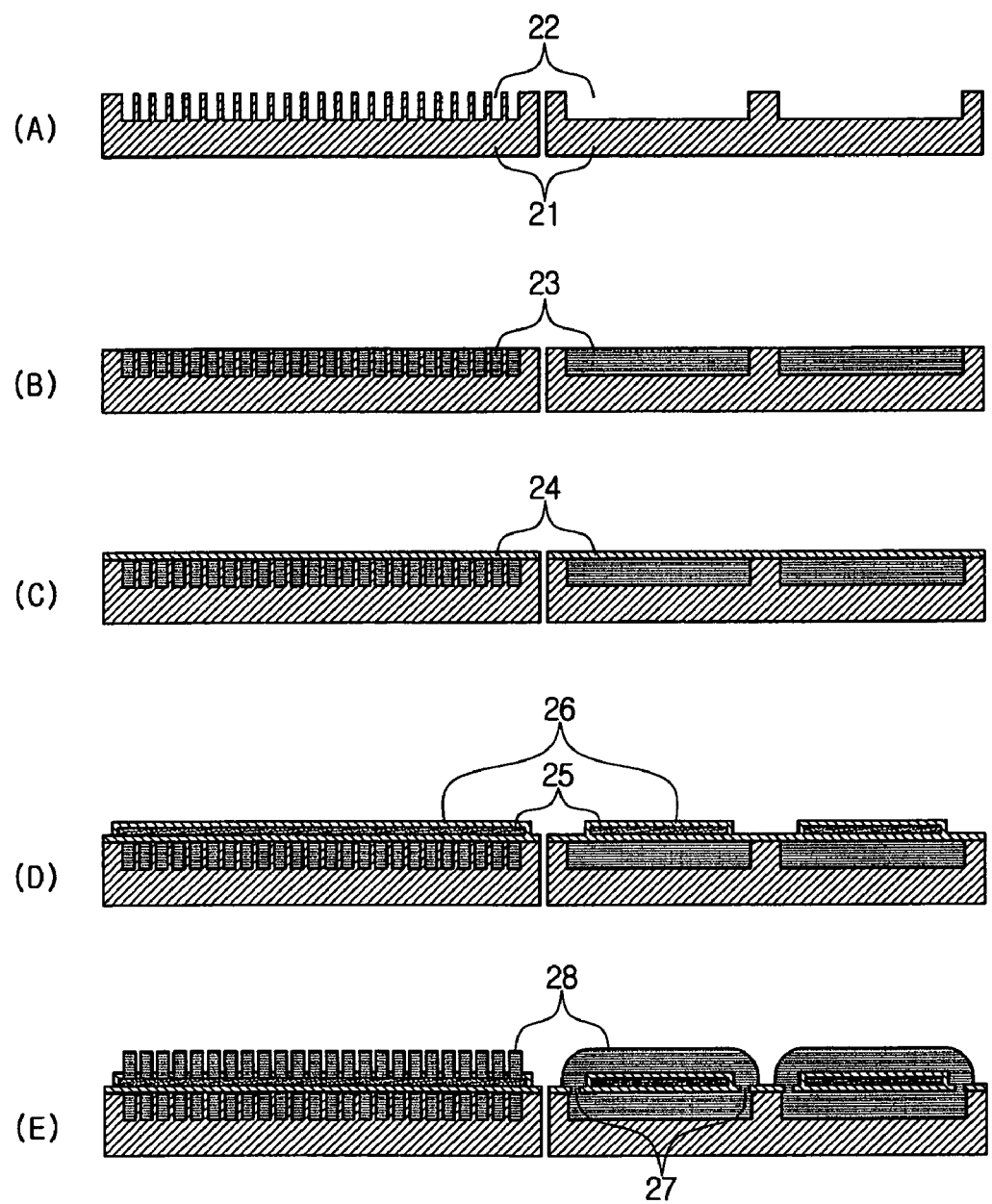
FIGS. 3A through 3E are sectional views taken along lines I-I and II-II of FIG. 1, showing a process of forming the fluxgate sensor of FIG. 1 on the semiconductor substrate.

First, by using a photosensitive material and an exposure on an upper side of a semiconductor substrate 21, a pattern is formed for an excitation coil and a pick-up coil, according to which the excitation coil and the pick-up coil alternately wind one time, respectively. Then, through an etching, a high-section-rate surface 22 is formed according to the pattern. Next, an oxide film (not shown) is formed over the etched section of the semiconductor substrate 21 for electric insulation (FIG. 3A). Then, for a metal-plating over the oxide film, a seed layer (not shown) is formed, and the metal layer, such as a copper layer, is formed, filling in the recessed parts of the high-section-rate surface 22 that are recessed by the etching of the upper portion of the seed layer. Then the upper portion of the substrate 21 is subjected to chemical mechanical polishing (CMP) so that the metal 23 filling in the recessed parts of the surface 22 can be insulated from each other (FIG. 3B).

Meanwhile, as shown in FIGS. 3A and 3B, forming of the high-section-rate surface 22 of the semiconductor substrate 21 and the lower portion of the pick-up coil winding can be achieved by other methods. A first example of another method is: first, an oxide film is formed on the semiconductor substrate 21 for insulation, and a seed layer for metal plating is formed on the oxide film. Next, a thick photo resist is applied on the upper portion of the seed layer and then patterned by etching. Next, by removing the thick photo resist and the seed layer, the lower portion for the excitation coil and the pick-up coil is formed.

On the upper portion of the substrate 21, which has the lower portion for the excitation coil and the pick-up coil, a first insulating layer 24 is formed (FIG. 3C). Then, first via holes (not shown) are formed in the first insulating layer, horizontally distanced from one and the other sides of the soft magnetic core by a predetermined distance, and interconnecting with the metal 23. Next, a soft magnetic film is applied on the upper portion of the first insulating layer 24, and the soft magnetic core 25 is formed through a patterning and etching. As a result, a second insulating layer 26 is formed on the upper portion of the semiconductor substrate (FIG. 3D). Then, second via holes 27 interconnecting with the metal 23 are formed in the second insulating layer 26, at locations corresponding to the first via holes.

Next, on the upper portion of the second insulating layer 26 having the second via holes 27 formed therethrough, a photosensitive material is applied, and patterned through the exposure corresponding to the upper portion of the excitation coil and the pick-up coil. Also according to a predetermined pattern, a shape of the upper portion (not shown) of the excitation coil and the pick-up coil is formed. Then, along the section of the patterned area, a seed layer (not shown) is formed. A second metal layer (not shown) is then formed, by secondly filling the etched area with metal 28. After that, in order for the metal 28 in the etched area to be insulated, the chemical mechanical polishing (CMP) is performed. By removing the photosensitive material applied onto the upper portion of the second insulating layer excluding the secondly-put metal 28, the upper portion of the excitation coil and the pick-up coil is formed (FIG. 3E).

Meanwhile, in addition to the process of forming the upper portion of the excitation coil and the pick-up coil as described above with reference to FIG. 3E, another method can be also used. One example will be described below.

First, after forming the seed layer on the upper portion of the second insulating layer 26 which has the second via hole 27 formed therein, the thick photo resist is applied onto the upper portion of the seed layer. By using the exposure with respect to the thick photo resist applied onto the upper portion of the seed layer, the pattern for the upper portion of the excitation coil and the pick-up coil is formed, and continuously, etching is performed according to such pattern. Next, the upper portion of the excitation coil and the pick-up coil is formed by putting the metal 28 into the etched area corresponding to the upper portion of the excitation coil and the pick-up coil, and then by removing the seed layer and the thick photo resist applied to the upper portion of the seed layer in a manner of insulating the metal 28 of the etched area.

Figure 4A:
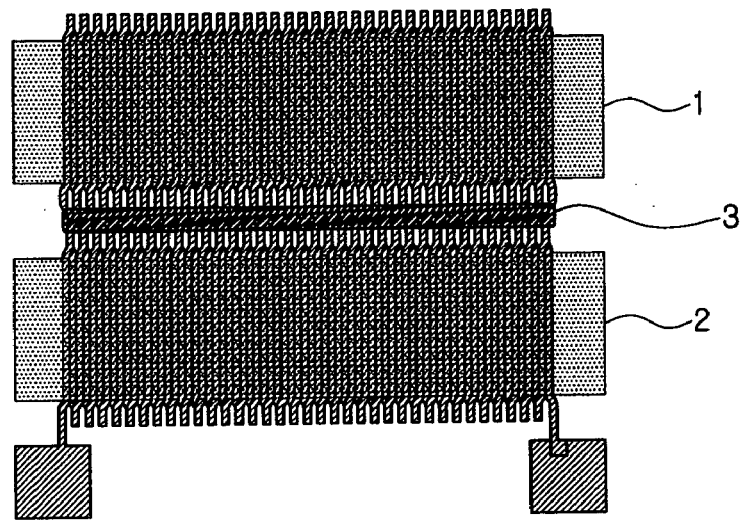
FIG. 4A is a plan view showing two bar-type soft magnetic cores arranged in the same plane in parallel relation, and an excitation coil of the united structure winding the two bar-type soft magnetic cores substantially in a number '8' pattern.
Figure 4B:
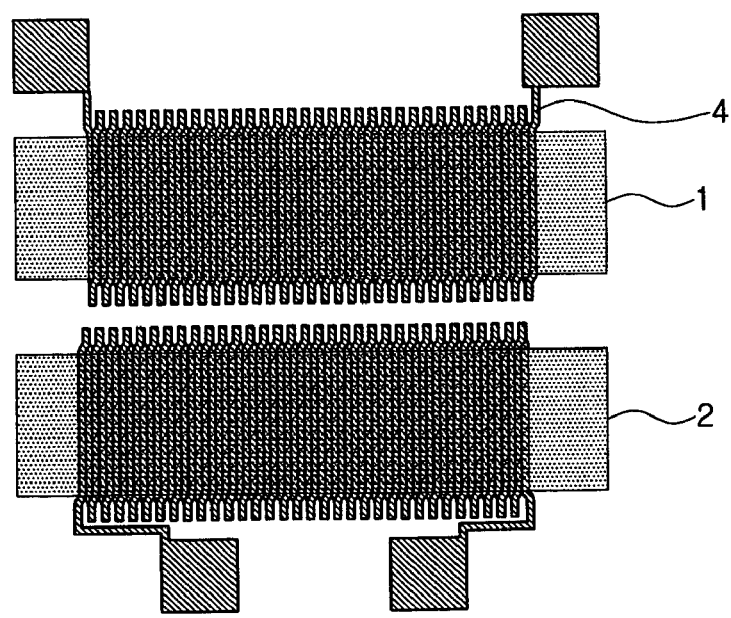
FIG. 4B is a plan view showing a pick-up coil winding the two bar-type soft magnetic cores of FIG. 4A substantially in a solenoid pattern.
Figure 4C:
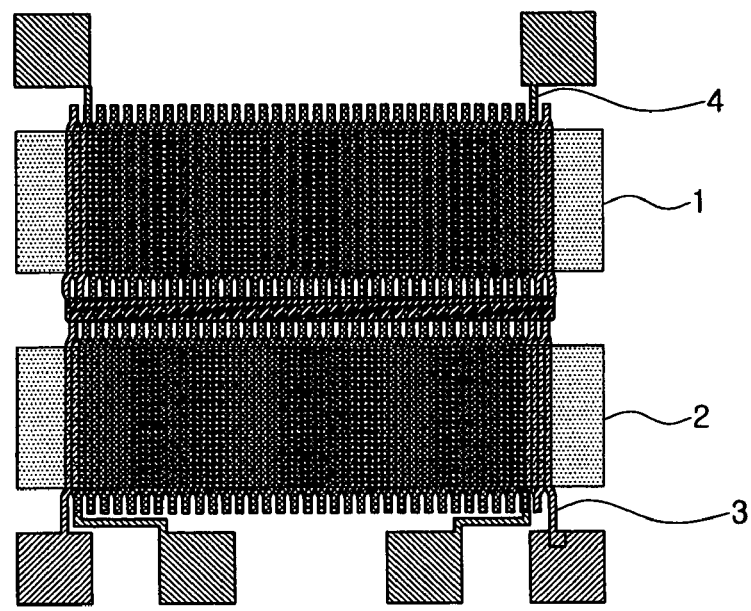
FIG. 4C is a plan view showing two bar-type soft magnetic cores placed on a same plane, and an excitation coil and a pick-up coil formed on the two bar-type soft magnetic cores altogether.

FIGS. 4A through 4C are plan views of the fluxgate sensor formed on the semiconductor substrate according to the first preferred embodiment of the present invention. More specifically, FIG. 4A is a plan view showing two bartype soft magnetic cores 1 and 2 formed on a same plane in parallel relation, with the excitation coil 3 of the united structure formed thereon. FIG. 4B is a plan view showing two bar-type soft magnetic cores 1 and 2 with a pick-up coil 4 of the separated structure formed thereon. FIG. 4C is a plan view showing two bar-type soft magnetic cores 1 and 2 placed in the same plane in parallel relation, with the excitation coil 3 and the pick-up coil 4 of FIGS. 4A and 4B formed thereon.

Figure 4D:
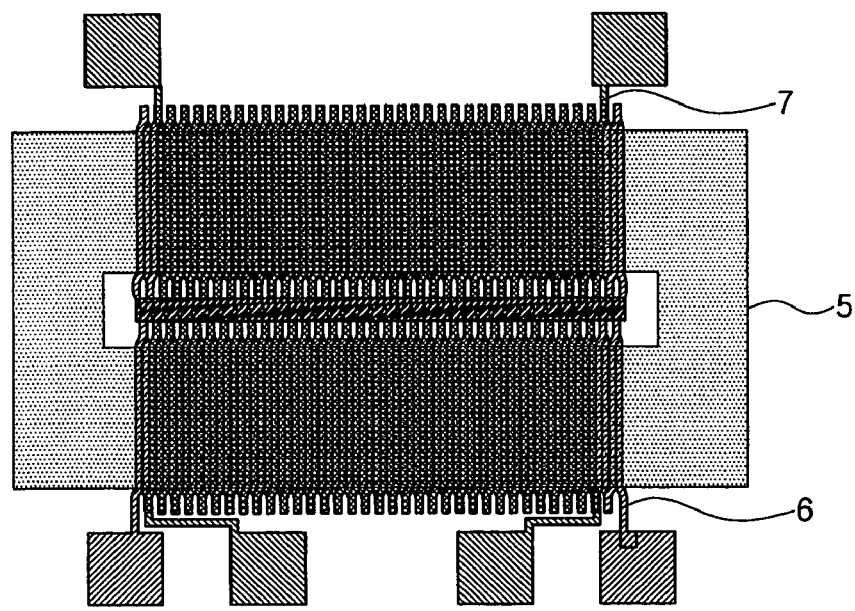
FIG. 4D is a plane view showing a rectangular-ring type soft magnetic core placed in the same plane of a semiconductor substrate, with an excitation coil of the united structure formed on two longer sides of the rectangular-type soft magnetic core, and a pick-up coil respectively winding the two longer sides of the rectangular-type soft magnetic core.

FIG. 4D is a plan view showing a rectangular-ring type soft magnetic core 5 in the same plane, with an excitation coil 6 of the united structure winding two longer sides of the rectangular-ring type core, and a pick-up coil 7 of the separated structure winding the two longer sides of the rectangular-ring type soft magnetic core respectively.

Figure 5:
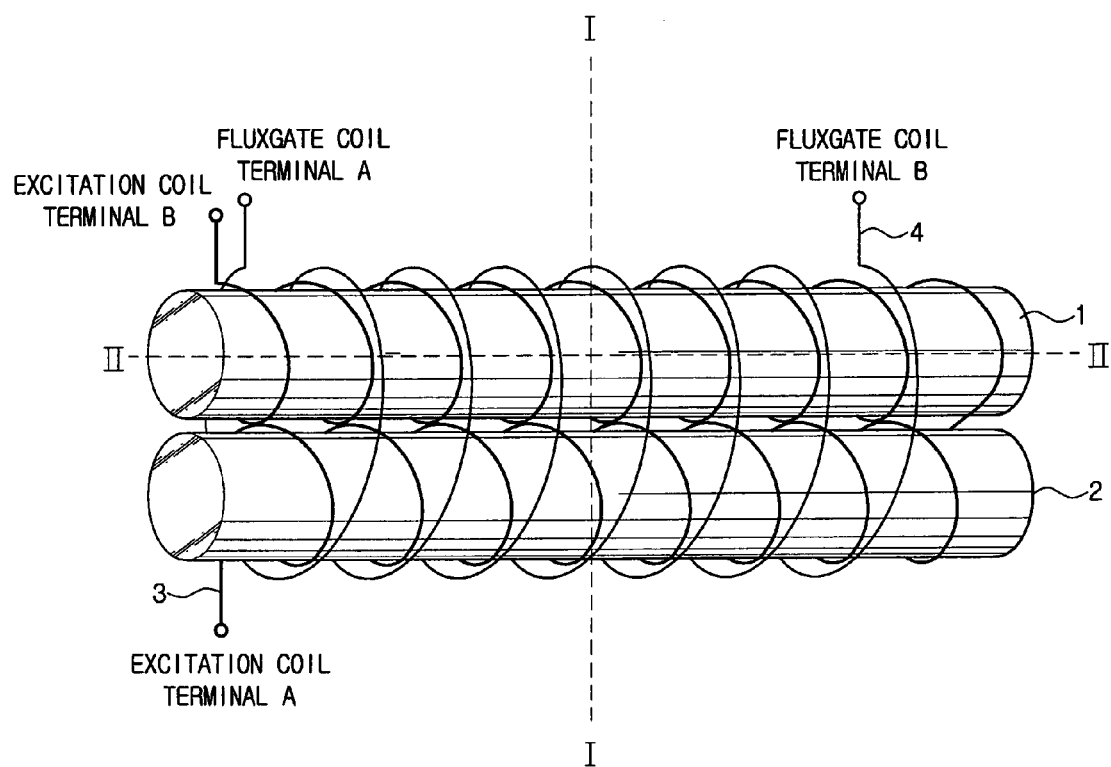
FIG. 5 is a view illustrating a fluxgate sensor integrated in a semiconductor substrate according to a second preferred embodiment of the present invention.

FIG. 5 is a view illustrating the fluxgate sensor integrated in the semiconductor substrate according to the second preferred embodiment of the present invention. In the fluxgate sensor, the excitation coil 3 separately winds the first and second bar-type soft magnetic cores 1 and 2, respectively, and the pick-up coil 4 winds over the excitation coil 3, around the first and second bar-type soft magnetic cores 1 and 2 altogether. Here, it is possible that the pick-up coil 4 is wound over the excitation coil 3, around the first and second bar-type soft magnetic cores 1 and 2, respectively. Alternatively, the first and second bar-type soft magnetic cores 1 and 2 shown in FIG. 5 can take the form of a rectangular-ring, and in this case, the excitation coil separately winds the two longer sides of the rectangular-ring type soft magnetic core in the direction of magnetic field detection, and the pick-up coil winds around the two longer sides in a solenoid pattern, to thereby offset the induction voltage. Here, the pick-up coil can be wound around the two longer sides of the rectangular-ring type soft magnetic core in solenoid pattern.

The induction voltage detected at the pick-up coil according to the second preferred embodiment is similar to the induction voltage detected in the excitation coil of the united structure according to the first preferred embodiment of the present invention. Also, the fluxgate sensor according to the second embodiment functions to offset the induction voltage in the absence of an external magnetic field, which is also similar to the first embodiment.

Figure 6A:
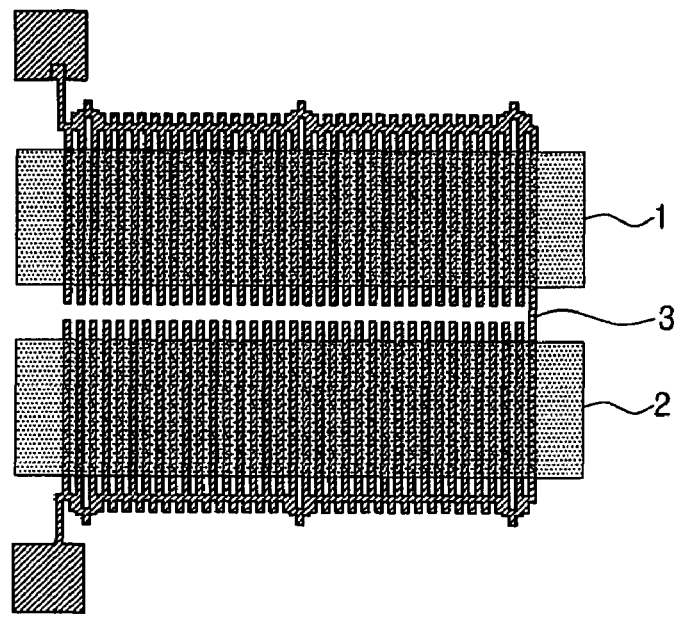
FIG. 6A is a plan view showing two bar-type soft magnetic cores formed in the same plane in parallel relation, with an excitation coil of the separated structure formed on the two bar-type soft magnetic cores.
Figure 6B:
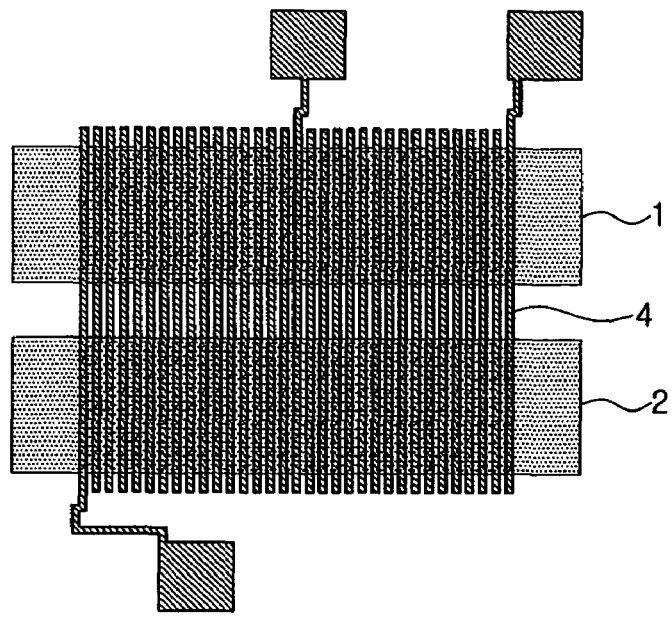
FIG. 6B is a plan view showing two bar-type soft magnetic cores placed in the same plane in parallel relation, which are wound together substantially in a solenoid pattern with a pick-up coil formed thereon.
Figure 6C:
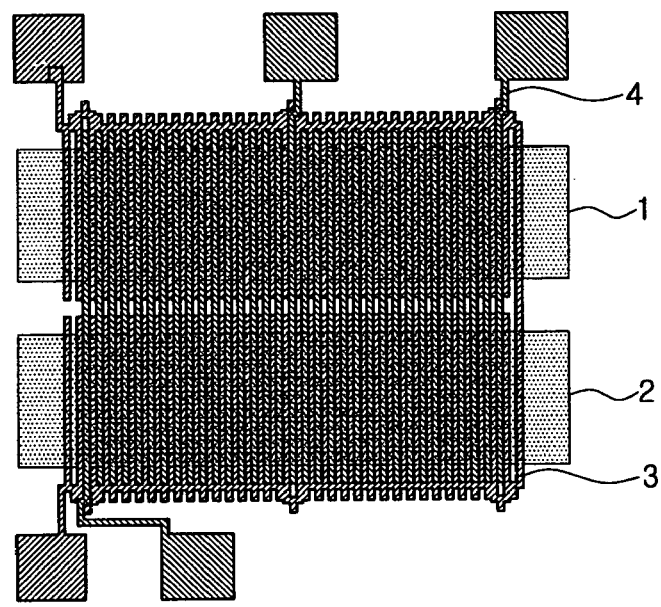
FIG. 6C is a plan view showing two bar-type soft magnetic cores placed in the same plane, with the excitation coil and the pick-up coil of FIGS. 6A and 6B formed on the two bar-type soft magnetic cores.

FIGS. 6A through 6C are plan views of the fluxgate sensor formed on the semiconductor substrate according to the second preferred embodiment of the present invention. More specifically, FIG. 6A is a plan view showing the excitation coil of the separated structure winding the first and second bar-type soft magnetic cores 1 and 2 placed in the same plane in parallel relation, and FIG. 6B is a plan view showing the pick-up coil 4 winding the first and second bar-type soft magnetic cores 1 and 2 in the same plane in parallel relation altogether. FIG. 6C is a plan view showing the excitation coil 3 and the pickup coil 4 winding the first and second bar-type soft magnetic cores 1 and 2 in the same plane.

Figure 6D:
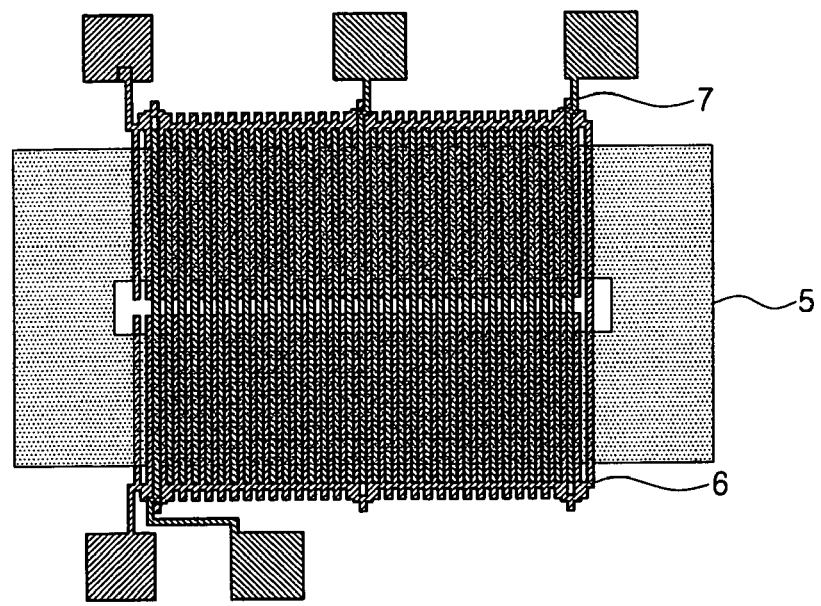
FIG. 6D is a plan view showing a rectangular-ring type soft magnetic core placed in the same plane of the semiconductor substrate of FIG. 6D, with an excitation coil of the separated structure respectively winding two longer sides of the rectangular-ring type soft magnetic core, and the pick-up coil winding the two longer sides of the rectangular-ring type soft magnetic core altogether.

FIG. 6D is a plan view showing a rectangular-ring type soft magnetic core 5 placed in the same plane of the semiconductor substrate, with the excitation coil 6 of the separated structure winding two longer sides of the rectangular-ring type soft magnetic core, and the pick-up coil 4 winding the two longer sides of the rectangular-ring type soft magnetic core altogether.

The fluxgate sensor described above can be used in various applications, such as, but not by way of limitation, a navigation system by terrestrial magnetism detection, an earth magnetism change monitor (earthquake prediction), a biological electric measurement device, and an apparatus for detecting defects in metals. As for indirect applications, the fluxgate sensor can also be used, for example, but not by way of limitation, in a magnetic encoder, a contactless potentiometer, an electric current sensor, a torque sensor, and a displacement sensor.

As the fluxgate sensor integrated in the semiconductor substrate according to the present invention can be integrated with other sensors and circuits, the overall size of the system can be greatly reduced, and low power consumption is achieved.

Also, the system can be compact-sized, and the sensitivity is kept high to detect even a weak external magnetic field as it variably drives the voltages induced from the respective cores of sides.

Also, as the fluxgate sensor according to the present invention can be produced at a cheaper price than the bar-type cores or annular cores, mass-production is enabled.

Although preferred embodiments of the present invention have been described, it will be understood by those skilled in the art that the present invention should not be limited to the described preferred embodiments, but various changes and modifications can be made within the spirit and scope of the present invention as defined by the appended claims.

What is claimed is:

1. A fluxgate sensor, comprising:
   a soft magnetic core which forms a closed magnetic path on a semiconductor substrate;
   an excitation coil formed as a first metal film, winding the soft magnetic core; and
   a pick-up coil formed as a second metal film for winding the soft magnetic core, wherein the soft magnetic core comprises two bars, the two bars disposed co-planar on a plane that runs substantially parallel with the substrate;
   wherein a longitudinal axis of the soft magnetic core is substantially parallel to the semiconductor substrate,
   wherein the semiconductor substrate includes a trench structure, and
   wherein a lower portion of the excitation coil and the pick up coil is embedded in the trench structure.

2. The fluxgate sensor of claim 1, wherein the two bars have their length in a direction of magnetic field detection.

3. The fluxgate sensor of claim 2, wherein the excitation coil has a structure of alternately winding the two bars substantially in a number '8' pattern.

4. The fluxgate sensor of claim 3, wherein the pick-up coil has a structure formed of winding the two bars altogether substantially in a solenoid pattern.

5. The fluxgate sensor of claim 3, wherein the pick-up coil has a structure formed of winding the two bars, respectively, and substantially in a solenoid pattern.

6. The fluxgate sensor of claim 2, wherein the excitation coil has a structure of winding the two bars, respectively, and substantially in a solenoid pattern.

7. The fluxgate sensor of claim 6, wherein the pick-up coil has a structure formed on a plane same as the excitation coil, winding the two bars altogether substantially in a solenoid pattern.

8. The fluxgate sensor of claim 6, wherein the pick-up coil has a structure formed of winding the two bars, respectively, and substantially in a solenoid pattern.

9. The fluxgate sensor of claim 1, wherein the soft magnetic core comprises a rectangular-ring.

10. The fluxgate sensor of claim 9, wherein the rectangular ring has its length in the direction of magnetic field detection.

11. The fluxgate sensor of claim 10, wherein the excitation coil has a structure of alternately winding two longer sides of the rectangular ring, substantially in a number '8' pattern.

12. The fluxgate sensor of claim 11, wherein the pick-up coil has a structure of winding the two longer sides of the rectangular ring altogether substantially in a solenoid pattern.

13. The fluxgate sensor of claim 11, wherein the pick-up coil has a structure of winding the two longer sides of the rectangular ring, respectively, and substantially in a solenoid pattern.

14. The fluxgate sensor of claim 10, wherein the excitation coil has a structure of winding the two longer sides of the rectangular ring, respectively, and substantially in a solenoid pattern.

15. The fluxgate sensor of claim 14, wherein the pick-up coil has a structure of winding the two longer sides of the rectangular ring altogether substantially in a solenoid pattern.

16. The fluxgate sensor of claim 14, wherein the pick-up coil has a structure of winding the two longer sides of the rectangular ring, respectively, and substantially in a solenoid pattern.

* * * * *